US012674233B2

(12) United States Patent
Yan et al.

(10) Patent No.: US 12,674,233 B2
(45) Date of Patent: Jul. 7, 2026

(54) RHYTHMIC DEPOSITION PRODUCTION METHOD AND EQUIPMENT FOR PEROVSKITE THIN FILM

(71) Applicant: Hangzhou Microquanta Semiconductor Co., Ltd., Hangzhou (CN)

(72) Inventors: Buyi Yan, Hangzhou (CN); Dehua Peng, Hangzhou (CN); Zhiming Zhong, Hangzhou (CN); Jizhong Yao, Hangzhou (CN)

(73) Assignee: HANGZHOU MICROQUANTA SEMICONDUCTOR CO., LTD., Hangzhou (CN)

( * ) Notice: Subject to any disclaimer, the term of this patent is extended or adjusted under 35 U.S.C. 154(b) by 411 days.

(21) Appl. No.: 18/036,521

(22) PCT Filed: Mar. 29, 2021

(86) PCT No.: PCT/CN2021/083701
§ 371 (c)(1),
(2) Date: May 11, 2023

(87) PCT Pub. No.: WO2022/116434
PCT Pub. Date: Jun. 9, 2022

(65) Prior Publication Data
US 2024/0016045 A1      Jan. 11, 2024

(30) Foreign Application Priority Data
Dec. 1, 2020      (CN) ........................ 202011387375.X

(51) Int. Cl.
*H10K 71/16*      (2023.01)
*C23C 14/08*      (2006.01)
(Continued)

(52) U.S. Cl.
CPC ............ *C23C 14/12* (2013.01); *C23C 14/088* (2013.01); *C23C 14/243* (2013.01); *C23C 14/54* (2013.01);
(Continued)

(58) Field of Classification Search
CPC ....... C23C 14/088; C23C 14/24; C23C 14/54; H10K 71/164; H10K 85/50
See application file for complete search history.

(56) References Cited

U.S. PATENT DOCUMENTS 5,672,252 A * 9/1997 Hayashi ............... H10N 30/076
204/192.18
10,580,585 B2   3/2020 Snaith et al.
(Continued)

FOREIGN PATENT DOCUMENTS

CN      107075657      8/2017
CN      107743530      2/2018
(Continued)

OTHER PUBLICATIONS

International Search Report and Written Opinion in International Appln. No. PCT/CN2021/083701, mailed on Sep. 7, 2021, 11 pages.

*Primary Examiner* — Jaehwan Oh
(74) *Attorney, Agent, or Firm* — PORUS IP LLC

(57) ABSTRACT

The present disclosure relates to a rhythmic deposition production method and equipment of a perovskite thin film. The method includes the followings: a to-be-deposited substrate pre-prepared with a precursor $BX_2$ thin film containing a perovskite precursor $BX_2$ material is placed into a deposition-reaction chamber for evaporating and depositing a precursor AX material; the deposition is suspended after a period of time such that the precursor AX material deposited on a surface of the precursor $BX_2$ thin film has sufficient time to diffuse into the precursor $BX_2$ thin film so as to form
(Continued)

a perovskite $ABX_3$ crystal; after a period of suspension, deposition is performed again, such that the deposition and suspension processes are alternately repeated rhythmically and the AX material enters the $BX_2$ thin film to fully react with the $BX_2$ material, so as to obtain an $ABX_3$ perovskite crystal without $BX_2$ material residual or with AX material surplus, until a perovskite $ABX_3$ thin film with a set thickness is obtained. Thus the rhythmic deposition process is ended. The present disclosure further provides an equipment using the method. In the present disclosure, continuous large-area production of the perovskite thin film is realized with high reliability and repeatability.

13 Claims, 5 Drawing Sheets

(51) Int. Cl.

| | |
|---|---|
| *C23C 14/12* | (2006.01) |
| *C23C 14/24* | (2006.01) |
| *C23C 14/54* | (2006.01) |
| *H10K 30/50* | (2023.01) |
| *H10K 85/50* | (2023.01) |

(52) U.S. Cl.
CPC ........... *H10K 30/50* (2023.02); *H10K 71/164* (2023.02); *H10K 85/50* (2023.02)

(56) References Cited

U.S. PATENT DOCUMENTS

| | | | | |
|---|---|---|---|---|
| 11,629,405 | B2* | 4/2023 | Bulovic | ............... H10K 71/164 |
| | | | | 427/248.1 |
| 2017/0040560 | A1* | 2/2017 | Martinson | ............. H10F 77/311 |
| 2017/0148579 | A1* | 5/2017 | Snaith | .................... H10K 85/50 |
| 2018/0174761 | A1 | 6/2018 | Kamino et al. | |
| 2020/0024733 | A1* | 1/2020 | Bulovic | ................ C23C 16/455 |

FOREIGN PATENT DOCUMENTS

| | | |
|---|---|---|
| CN | 109970353 | 7/2019 |
| CN | 110670045 | 1/2020 |

* cited by examiner

1

RHYTHMIC DEPOSITION PRODUCTION METHOD AND EQUIPMENT FOR PEROVSKITE THIN FILM

CROSS REFERENCE TO RELATED APPLICATIONS

This application is a U.S. national phase filing under 35 U.S.C. § 371 of International application number PCT/CN2021/083701, filed Mar. 29, 2021, which claims priority from Chinese Application No. 202011387375.X, filed Dec. 1, 2020. The entire contents of the prior applications are incorporated herein by reference in their entirety.

TECHNICAL FIELD

The present disclosure relates to the field of production technologies of perovskite solar modules, and in particular to a rhythmic deposition production method and equipment for perovskite thin film.

BACKGROUND a light absorption layer of perovskite solar cell is a thin film layer formed by using an organic metal halide perovskite material. The formation process of the film layer includes two major methods: a solution method and a vapor phase method. The solution method requires simple equipment and some progress has been made in large-area preparation. But this method requires very special solution formula and the crystallization process when the solution dries into a solid thin film is complex, making it difficult to control and liable to external environment influences, leading to poor repeatability of the process. Therefore, in-depth research has to be conducted to make the solution based process a reliable one in large area perovskite film production. The vapor phase method mainly includes: a dual-source co-evaporation method and a chemical vapor deposition method and the like. Due to good film quality and easy-to-control uniformity of the perovskite thin film prepared by the vapor phase method, large area production can be realized. The method has already been widely applied in the industrial production of thin film solar cells such as copper indium gallium selenium (CIGS) cells and cadmium telluride (CdTe) cells. In addition, another method applicable to preparation of a perovskite solar cell is a solution-assisted vapor phase method, in which the solution method and the vapor phase method are combined to take advantage of the convenience of solution method while retaining the good film uniformity of the thin films prepared by the vapor phase method.

In the vapor film deposition process of the conventional thin film solar cells, the deposition process is continuous. Generally, a to-be-deposited substrate goes into a film deposition region under the drive of a transmission apparatus, and then the material is continuously deposited onto the substrate in the film deposition region and then delivered by the transmission apparatus after the film deposition process is completed. But, this process is not applicable to the preparation of the perovskite thin film by using the vapor phase method, especially not applicable to the preparation of the perovskite thin film by using the solution-assisted vapor phase method. The major reason is that, in the process of preparation of the perovskite thin film by using solution-assisted vapor phase method, a $BX_2$ thin film is firstly formed, and then AX vapor generated by evaporation is enabled to reach the surface of the $BX_2$ thin film and diffuse into $BX_2$ thin film for reaction so as to form $ABX_3$. In the above process, the AX material has two kinetic processes after reaching the surface of the $BX_2$ thin film: diffusion process and reaction process. The two processes are competitive. If the AX is to be fully reacted with the $BX_2$, the two kinetics processes must be well balanced. However, if the AX material is evaporated continuously, due to the unique characteristics of the AX material vapor, the AX material cannot fully enter the $BX_2$ material for complete reaction and hence, a dense AX-rich perovskite is formed on the surface of the $BX_2$ material. As a result, the formed perovskite thin film has either $BX_2$-rich perovskite deep insides (because the AX material cannot diffuse into it) or AX-rich perovskite on its surface. In order to address the above problem, a deposition method with intermittent rhythm is proposed here to enable AX to fully enter $BX_2$ for reaction.

Due to the intermittence nature of the transverse growth of uniform perovskite crystals, continuous deposition of corresponding material will result in excessive growth or abnormal stoichiometric ratio of the as-formed perovskite $ABX_3$ film, which may lead to lattice distortion and deformation etc. Therefore, it is required to perform intermittent rhythm control on the deposition process.

SUMMARY

In order to address the technical problems, the present disclosure provides a rhythmic deposition production method and equipment for perovskite thin film, which has high reliability and high repeatability and is capable of realizing continuous large-area production of the perovskite thin film.

The present disclosure is implemented by providing a perovskite thin film deposition method with intermittent rhythm, which includes the following process.

A to-be-deposited substrate prepared with a precursor $BX_2$ thin film containing a perovskite precursor $BX_2$ material is placed into a deposition-reaction chamber for evaporating and depositing a precursor AX material; the deposition is suspended after a period of time such that the precursor AX material deposited on a surface of the precursor $BX_2$ thin film has sufficient time to diffuse into the precursor $BX_2$ thin film so as to form a perovskite $ABX_3$ crystal; after a period of suspension, deposition is resumed, such that the deposition and suspension processes are alternately repeated rhythmically and the AX material enters the $BX_2$ thin film to fully react with the $BX_2$ material, so as to obtain an $ABX_3$ perovskite crystal without $BX_2$ rich or with AX rich, wherein the deposition duration and the suspension duration are preset, and the rhythmic deposition process is ended after a perovskite $ABX_3$ thin film with a set thickness is obtained.

The precursor $BX_2$ material is a metal halide material, and the precursor AX material is an organic halide powder material, wherein A is any one of monovalent cations of methylamino $CH_3NH_3^+$, ethylamino $CH_3CH_2NH_3^+$, formamidino $CH(NH_2)_2^+$, acetamidino $CH_3C(NH_2)_2^+$, $Na^+$, $K^+$, $Rb^+$ and $Cs^+$, B is any one of divalent metal cations of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, and X is any one of monovalent anions of iodine, bromine, chlorine and astatine.

The present disclosure is further implemented by providing a production equipment of a perovskite thin film with intermittent rhythm, including: a deposition-reaction chamber. The deposition-reaction chamber includes two functional regions, one is a deposition functional region and the other a reaction functional region. The deposition functional region includes one or more deposition segments, the deposition segments include at least two continuously-arranged unit deposition working positions, an evaporation source is disposed inside each unit deposition working position, and a precursor AX material powder to be evaporated is placed in the evaporation sources; the reaction functional region includes one or more reaction segments, the reaction segments include at least two continuously-arranged unit reaction working positions, and an evaporation source is not disposed inside each unit reaction working position. The deposition segments are spaced apart from the reaction segments, the deposition-reaction chamber is in communication with a vacuum pump through a pipe, and a heating apparatus is further disposed inside the deposition-reaction chamber to heat a to-be-deposited substrate pre-prepared with a precursor $BX_2$ thin film containing a perovskite precursor $BX_2$ material.

The precursor $BX_2$ material is a metal halide material, and the precursor AX material powder is an organic halide powder material, wherein A is any one of monovalent cations of methylamino $CH_3NH_3^+$, ethylamino $CH_3CH_2NH_3^+$, formamidino $CH(NH_2)_2^+$, acetamidino $CH_3C(NH_2)_2^+$, $Na^+$, $K^+$, $Rb^+$ and $Cs^+$, B is any one of divalent metal cations of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, and X is any one of monovalent anions of iodine, bromine, chlorine and astatine.

The present disclosure is further implemented by providing a method of depositing a perovskite thin film on a substrate by using the production equipment of a perovskite thin film with intermittent rhythm as mentioned above. The method includes the following steps:

at step 1, adding a precursor AX powder material to the evaporation source of each unit deposition working position in the deposition-reaction chamber, adjusting a vacuum degree of the deposition-reaction chamber and starting the heating apparatus;

at step 2, placing a to-be-deposited substrate pre-prepared with a precursor $BX_2$ thin film containing a perovskite precursor $BX_2$ material into the load chamber and then transporting into the deposition-reaction chamber and enabling the to-be-deposited substrate to sequentially go through the deposition working positions and the reaction working positions and finally obtaining a perovskite $ABX_3$ thin film generated by complete reaction on the substrate.

Compared with the prior arts, in the deposition method and production equipment of a perovskite thin film with intermittent rhythm according to the present disclosure, the deposition of the precursor AX material on the surface of the precursor $BX_2$ thin film is performed with the deposition and reaction working positions spaced apart, such that the precursor AX material gradually diffuses into the precursor $BX_2$ thin film for full reaction so as to generate a perovskite $ABX_3$ thin film, which improves the reaction rate with high reliability and high repeatability, facilitating implementation of continuously large-area production of the perovskite thin film.

DETAILED DESCRIPTION OF THE EMBODIMENTS

In order to more clearly describe the technical problems to be solved, the technical solutions and the technical effects of the present disclosure, the present disclosure will be further described in details below in combination with drawings and embodiments. It should be understood that the specific embodiments described herein are used only to explain the present disclosure rather than limit the present disclosure.

A preferred embodiment of a rhythmic deposition production method of a perovskite thin film in the present disclosure is implemented in the following process.

A to-be-deposited substrate pre-prepared with a precursor $BX_2$ thin film containing a perovskite precursor $BX_2$ material is placed into a deposition-reaction chamber for evaporating and depositing a precursor AX material; the deposition is suspended after a period of time such that the precursor AX material deposited on a surface of the precursor $BX_2$ thin film has sufficient time to diffuse into the precursor $BX_2$ thin film so as to form a perovskite $ABX_3$ crystal; after a period of suspension, deposition is performed again, such that the deposition and suspension processes are alternately repeated rhythmically and the AX material enters the $BX_2$ thin film to fully react with the $BX_2$ material, so as to obtain an $ABX_3$ perovskite crystal without $BX_2$ material residual or with AX material surplus, wherein the deposition duration and the suspension duration are preset, and the rhythmic deposition process is ended after a perovskite $ABX_3$ thin film with a set thickness is obtained.

The precursor $BX_2$ material is a metal halide material, and the precursor AX material is an organic halide powder material, wherein A is any one of monovalent cations of methylamino $CH_3NH_3^+$, ethylamino $CH_3CH_2NH_3^+$, formamidino $CH(NH_2)_2^+$, acetamidino $CH_3C(NH_2)_2^+$, $Na^+$, $K^+$, $Rb^+$ and $Cs^+$, B is any one of divalent metal cations of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, and X is any one of monovalent anions of iodine, bromine, chlorine and astatine.

The prepared perovskite $ABX_3$ thin film has a thickness of 100 nm to 1000 nm. The deposition process and the suspension process are both performed in a vacuum environment with a vacuum degree of 1 Pa to 50000 Pa. An evaporation temperature of the precursor AX material is 80° C. to 300° C.

The present disclosure further provides a rhythmic deposition production equipment of a perovskite thin film, which employs the above rhythmic deposition production method of a perovskite thin film.

Figure 2:
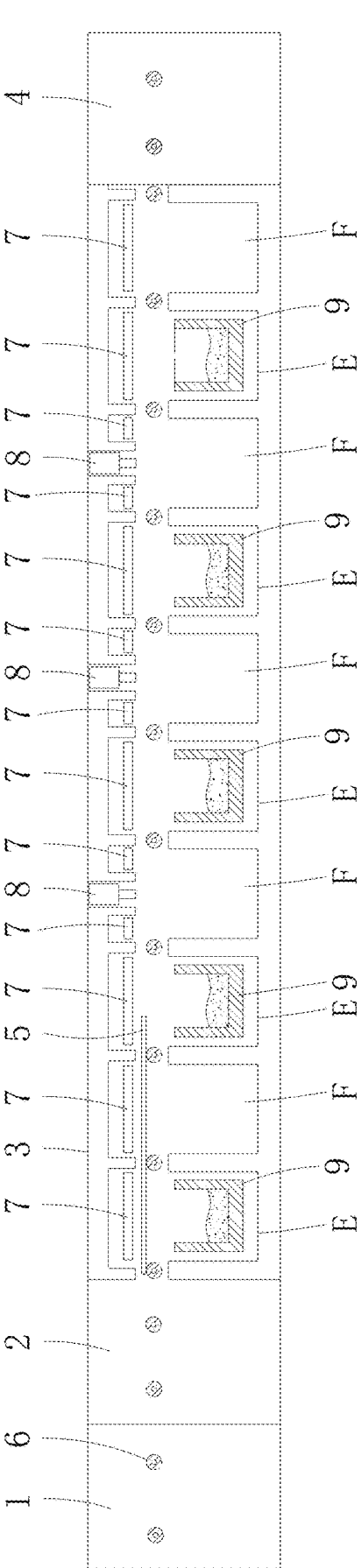
FIG. 2 is a schematic diagram illustrating a structural principle of a rhythmic deposition production method and equipment of a perovskite thin film according to an embodiment 1 of the present disclosure.

By referring to FIG. 2, the rhythmic deposition production equipment of a perovskite thin film according to the present disclosure includes a load chamber 1, a heating chamber 2, a deposition-reaction chamber 3, an unload chamber 4, and a transport apparatus for transporting a to-be-deposited substrate 5. The transport apparatus includes rollers 6 driven by a servo motor, where the rollers 6 are arranged in equal spacing of no more than a half of a size of a long side of the to-be-deposited substrate 5. The rollers 6 drive a support roll on which the to-be-deposited substrate 5 moves with a deposition surface facing downward.

The load chamber 1 and the heating chamber 2 are sequentially disposed at a front portion of the deposition-reaction chamber 3, and the unload chamber 4 is disposed at a rear portion of the deposition-reaction chamber 3. The transport apparatus sequentially communicates the load chamber 1, the heating chamber 2, the deposition-reaction chamber 3 and the unload chamber 4 respectively. After the to-be-deposited substrate 5 enters the load chamber 1, the to-be-deposited substrate 5 moves, by use of the transport apparatus, through the heating chamber 2 and the deposition-reaction chamber 3 sequentially, and finally out of the unload chamber 4.

The deposition-reaction chamber 3 includes two functional regions: a deposition functional region and a reaction functional region. The deposition functional region includes one or more deposition segments, the deposition segments include at least one unit deposition working position E, an evaporation source is disposed inside each unit deposition working position E, and a precursor AX material powder to be evaporated is placed in the evaporation sources. The reaction functional region includes one or more reaction segments, the reaction segments include at least one unit reaction working position F, an evaporation source is not disposed inside each unit reaction working position. The deposition segments are spaced apart from the reaction segments. The deposition-reaction chamber 3 is in communication with a vacuum pump (not shown) through a pipe. A heating apparatus 7 is further disposed inside the deposition-reaction chamber 3 to heat the to-be-deposited substrate 5 pre-prepared with a precursor $BX_2$ thin film containing a perovskite precursor $BX_2$ material.

A thin film detection apparatus 8 is disposed on some of the unit reaction working positions F to track the thin film reaction process in real time. The thin film detection apparatuses 8 include one or combination of several of an imaging detection system, an ultraviolet visible light spectrometric detection system (UV-vis), a photoluminescent detection system (PL), and an X-ray diffraction system (XRD) and the like, so as to monitor a reaction process of the perovskite thin film in real time, thus adjusting the opening or closing of the evaporation sources of the remaining deposition segments. A double-opening baffle plate is disposed at the opening of the evaporation sources of the rear section of the deposition-reaction chamber 3 and can be controlled by a software to open and close, so as to control the reaction process of the perovskite thin film. The thin film detection apparatuses 8 may be specifically mounted at the equally proportionally spaced positions of 50%, 75%, and 100% of the deposition-reaction chamber 3.

Figure 3:
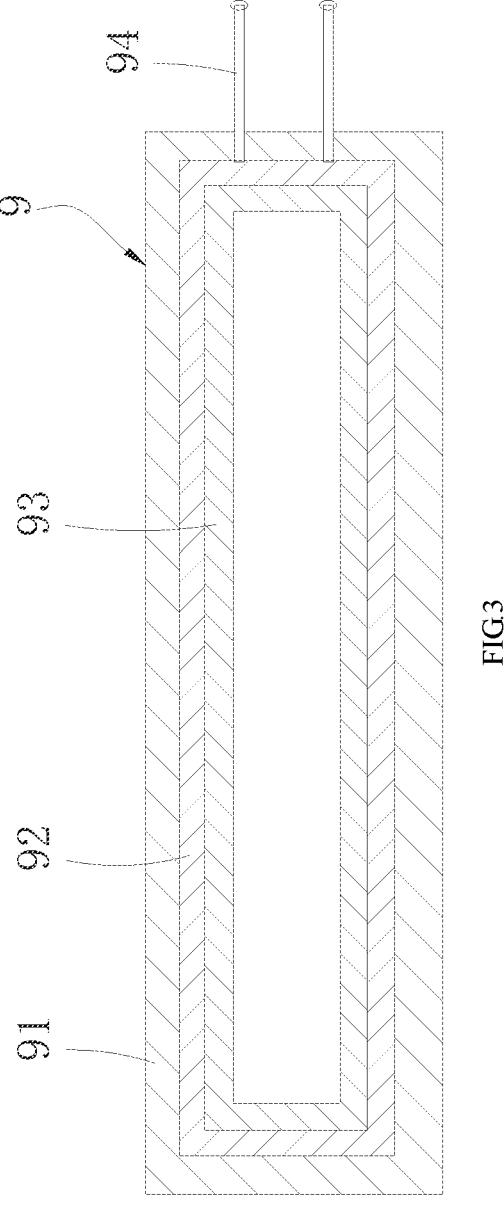
FIG. 3 is a sectional view of an evaporation crucible in FIG. 1.

By referring to FIG. 3 (top view of the evaporation source), the evaporation source includes an evaporation crucible 9 with an opening facing upward. The evaporation crucible 9 is matched in size with a space of an evaporation source mounting groove. The evaporation crucible 9 includes a heat insulation layer 91 disposed outside, a heating layer disposed in middle, and a heat conducting layer disposed inside. The heating layer 92 is provided with a heating power line 94 connected to an external power supply interface. The material of the inner heat conducting layer 93 is preferably graphite, the middle heating layer 92 usually uses resistance heating, and the power supply interface extends through the heat insulation layer 91 to connect with a power supply interface in the evaporation source mounting groove.

With continuous reference to FIG. 2, after the perovskite precursor $BX_2$ material is deposited to form the precursor $BX_2$ thin film, the precursor $BX_2$ thin film needs to enter a vacuum environment, where a vacuum degree in the deposition-reaction chamber 3 is 1 Pa to 50000 Pa. Then, the precursor AX material is heated to form its vapor (a heating temperature is 80° C. to 300° C.) and then deposited on the precursor $BX_2$ thin film for reaction, so as to form a perovskite $ABX_3$ thin film. The precursor AX material is placed in the evaporation crucibles 9. The deposition and reaction processes are to be alternately performed, namely, deposition for a while—reaction for a while—deposition for a while—deposition for a while. During deposition, under the region passed by the substrate 5 is the evaporation crucible 9 holding the precursor AX material, whereas during reaction, under the region passed by the substrate 5 is no evaporation crucible 9. Therefore, along a linear movement direction of the substrate 5, the evaporation crucibles 9 are alternately arranged, such that the evaporation crucibles 9 are disposed on some working positions and no evaporation crucibles 9 are disposed on other working positions. But, in a conventional perovskite film deposition process, the film deposition process is continuous.

The evaporation sources used in the present disclosure are detachable evaporation sources. The evaporation sources can be mounted to the corresponding evaporation source mounting grooves as material deposition segments as required by the rhythmic production whereas the working positions without the evaporation source are used as material reaction segments. The basic rhythmic production mode is that the deposition segments and the reaction segments are alternately disposed in equal spacing. A gas pressure required by the entire deposition chamber 3 is controlled by a vacuum adjustment system formed by a vacuum gauge, a vacuum pump and a gas replenishing pipe. The heating apparatus 7 is disposed at the top position corresponding to each evaporation source mounting groove to maintain a temperature required for perovskite crystallization reaction.

The unit deposition working positions E have a length of $L_{di}=v*t_d/n$, and the unit reaction working positions F have a length of $L_{ri}=v*t_r/m$, wherein, v is a moving speed of the to-be-deposited substrate (cm/s), $t_d$ is a deposition time (s) required to form a good perovskite thin film, $t_r$ is a reaction time (s) required to form a good perovskite thin film, and $t_d:t_r=1:0.5$ to 1:100, n refers to a number of the unit deposition working positions, m refers to a number of the unit reaction working positions.

Specifically, the lengths of the deposition segments and the reaction segments of the deposition-reaction chamber 3 sequentially decrease respectively along the direction of the front and rear sections of the deposition-reaction chamber 3, and in other words, the number of the unit working positions included in the deposition segments and the reaction segments decreases respectively along the direction of the front and rear sections, namely, the lengths of the deposition segments and the reaction segments in the front section of the deposition-reaction chamber 3 are greater than the respective lengths of the deposition segments and the reaction segments in the rear section of the deposition-reaction chamber 3.

The above disposal is based on the following principle: in a practical production of the perovskite thin film, if the deposition and the reaction processes are only alternated once, severely excessive deposition and incomplete reaction and the like may occur, which affects the yield and the repeatability of the process. Hence, a preferred solution is that uniform alternation is repeated many times, which is based on the thought that the long deposition function region and reaction function region are respectively split into small and spaced-apart deposition segments and reaction segments. In this arrangement, each time a small amount of reactant is deposited on the substrate 5, the amount of reactant can be quickly reacted. In this way, the amount of reactant deposited on the substrate 5 each time the substrate 5 passes through the deposition segments can be greatly reduced (the deposition amount of each segment is 1/n of the previous amount). Based on the principle of the reaction kinetics, this will be helpful to quick reaction of the reactant when the reactant passes through the reaction segments, so as to reduce the circumstances of excessive deposition or incomplete reaction or the like, thus improving the yield and the repeatability of the process. Furthermore, each reaction segment and deposition segment can be heated independently by their own heating apparatus. With this arrangement, based on actual reaction conditions, the temperature of each segment can be controlled independently and even the heating of some regions is shut down such that the reaction is more compliant with the actual conditions.

Figure 1:
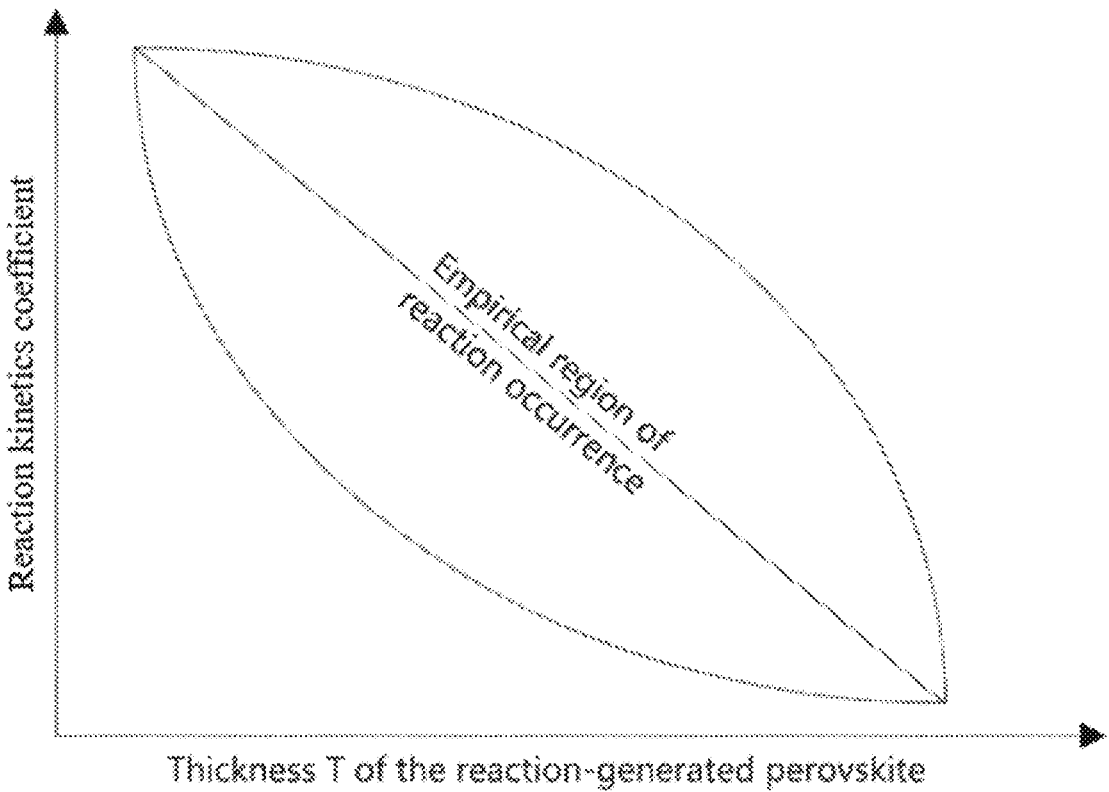
FIG. 1 is a schematic diagram illustrating a relationship curve between a thickness of a reaction-generated perovskite and a reaction kinetics coefficient.

On the other hand, based on the principle of reaction kinetics, the reaction can be slowed down along with generation of the previous reactant as shown in FIG. 1. For this case, the arrangement can be adjusted correspondingly such that the length of the working positions in the front section of the deposition-reaction chamber 3 is greater than the length of the working positions in the rear section of the deposition-reaction chamber 3.

Specifically, in the rhythmic deposition production equipment of a perovskite thin film in the present disclosure, the gas pressure of the deposition-reaction chamber 3 is controlled to 1 Pa to 50000 Pa, the temperature of the heating chamber 2 is set to 100° C. to 400° C., the temperature of the evaporation sources is controlled to 80° C. to 300° C., the temperature of the heating apparatus is controlled to 50° C. to 250° C., and the speed of the rollers is adjustable in a range of 1 mm/s to 400 mm/s.

The present disclosure further provides a method of depositing a perovskite thin film on a substrate by using the above rhythmic deposition production equipment of a perovskite thin film. The method includes the following steps.

At step 1, a precursor AX powder material is added to the evaporation source of each unit deposition working position E in the deposition-reaction chamber 3, a vacuum degree of the deposition-reaction chamber 3 is adjusted and the heating apparatus is started.

At step 2, a to-be-deposited substrate 5 pre-prepared with a precursor $BX_2$ thin film containing a perovskite precursor $BX_2$ material is placed into the load chamber, and then transported into the deposition-reaction chamber 3 to enable the to-be-deposited substrate 5 to sequentially go through the unit deposition working positions E and the unit reaction working positions F and finally a perovskite $ABX_3$ thin film generated by reaction is obtained on the substrate. When the to-be-deposited substrate 5 performs deposition-reaction in the deposition-reaction chamber 3, the thin film detection apparatus 8 mounted on the top of some reaction working positions tracks the reaction process of the perovskite thin film in real time.

The rhythmic deposition production method and equipment for a perovskite thin film in the present disclosure will be further described below in combination with specific embodiments.

Embodiment 1

With continuous reference to FIG. 2, the first rhythmic deposition production equipment for a perovskite thin film as disclosed by the present disclosure includes the load chamber 1, the heating chamber 2, the deposition-reaction chamber 3 and the unload chamber 4. The load chamber 1 has the effect of a transition chamber to enable the to-be-deposited substrate 5 to enter the low-pressure chamber from external normal pressure. The heating chamber 2 is in communication with the deposition-reaction chamber 3, and the chamber temperature of the heating chamber 2 is higher than the temperature of the deposition-reaction chamber 3, such that the to-be-deposited substrate 5 is heated quickly to a reaction temperature. Then, the to-be-deposited substrate 5 enters the deposition-reaction chamber 3 for reaction. The to-be-deposited substrate 5 is conveyed by rollers 6 driven by the servo motor, where the to-be-deposited substrate 5 is placed with the deposition surface facing down on the support roll of the rollers 6. The support roll is used to support the to-be-deposited substrate 5 to prevent the deposition surface from contacting with the rollers 6 which are arranged in equal spacing of no more than a half of the size of the long side of the to-be-deposited substrate 5. An evaporation source mounting groove with a power supply interface for mounting the evaporation source is disposed between every two rollers 6 in the deposition-reaction chamber 3. The evaporation sources may be mounted in the evaporation source mounting grooves to form the deposition segments or no evaporation sources are mounted in the evaporation source mounting grooves to form the reaction segments, which can be determined based on the requirements of the rhythmic production. As shown in FIG. 2, the basic rhythmic production mode is that the deposition segments and the reaction segments are alternately disposed in equal spacing. Only five evaporation sources are shown herein. Of course, there may be more evaporation sources mounted in practical productions.

In the deposition-reaction chamber 3, a heating apparatus 7 is disposed on the top corresponding to each evaporation source mounting groove, and mounted below a top cover of the chamber and close to the to-be-deposited substrate 5 to maintain a temperature required for reaction of the perovskite deposited on the to-be-deposited substrate 5. The reaction gas pressure in the entire deposition-reaction chamber 3 is maintained by a vacuum adjustment system formed of a vacuum gauge, a vacuum pump and a gas replenishing pipe which are not marked in the drawings. Furthermore, a thin film detection apparatus 8 is mounted at the top of some reaction segments to detect, in real time, a reaction state of the thin film formed on the to-be-deposited substrate Sand transmit information detected to a control system of entire production line. The control system may determine the closing or opening of subsequent evaporation sources based on a deviation value between state information of the current to-be-deposited substrate 5 and state information of standard substrate. A double-opening baffle plate is disposed at the opening of the evaporation sources of the rear section of the deposition-reaction chamber 3 and can be controlled by a software to open and close, so as to control the reaction process of the perovskite thin film. The thin film detection apparatuses include one or combination of several of an imaging detection system, an ultraviolet visible light spectrometric detection system (UV-vis), a photoluminescent detection system (PL), and an X-ray diffraction system (XRD) and the like. The entire production line is connected with control system via the PID controller and various sensors, and various operations may be controlled on a human-machine operation interface of the control system.

The basic process of preparing a perovskite thin film by using the rhythmic deposition production equipment of a perovskite thin film shown in the present embodiment may include the following steps.

At step 11, the top cover of the deposition-reaction chamber 3 is opened, and the evaporation sources are mounted in equal spacing in the evaporation source mounting grooves, with the openings of the evaporation sources facing upward. The power supply interface on the evaporation sources is connected with the power supply interface in the evaporation source mounting grooves. Next, a precursor AX material powder is added to each evaporation source in an amount taking up ⅓ to ⅔ of a groove volume of the evaporation source, and the material powder usually is an organic halide powder material.

At step 12, the top cover of the deposition-reaction chamber 3 is closed, and then vacuumization is performed for the chamber by using a vacuum pump, and at the same time, the following process parameters are set in an operation software in the control system: the temperature of the heating chamber 2 is set to 100° C. to 400° C., the heating temperature of the evaporation source is set to 80° C. to 300° C., the temperature of the heating apparatus 7 is set to 50° C. to 250° C., the evaporation gas pressure of the chamber is set to 1 Pa to 50000 Pa, and the transmission speed of the rollers 6 are set to 1 mm/s to 400 mm/s and the like.

At step 13, a metal halide film layer is pre-prepared on the to-be-deposited substrate 5, and then the to-be-deposited substrate 5 is placed with a film surface facing down on the support roll located before the load chamber 1. The automatic running mode is started in the control software, and at this time, the door of the load chamber is opened, and the to-be-deposited substrate 5 is conveyed into the load chamber under the drive of the rollers 6, and then the door of the load chamber 3 is closed. The vacuum pump is started to lower the gas pressure in the chamber. When the gas pressure is lowered to the reaction gas pressure, a door between the load chamber 1 and the heating chamber 2 is opened. Then, the to-be-deposited substrate 5 enters the heating chamber 2 and then is quickly heated to the reaction temperature and enters the deposition-reaction chamber 3.

At step 14, after entering the deposition-reaction chamber 3, the to-be-deposited substrate 5 firstly passes through the first unit deposition working position and organic halide gaseous molecules generated by evaporation of the evaporation source are firstly deposited on the metal halide surface of the to-be-deposited substrate 5 and subjected to reaction to form a perovskite crystal. At the same time, the organic halide molecules on the surface may also perform diffusion reaction into the film layer. When the to-be-deposited substrate 5 continues running to the first unit reaction working position, the material deposition on the surface is suspended but the molecular diffusion reaction inside the film layer still continues, so as to enable the organic halide deposited previously to be fully reacted. Next, the to-be-deposited substrate 5 continues running to the second unit deposition working position, and new organic halide is deposited on the surface and diffused into the film layer for reaction. The two processes are alternately performed along with the movement of the to-be-deposited substrate 5 in the deposition-reaction chamber 3, until reaction is completed and the to-be-deposited substrate 5 is delivered out of the unload chamber 4. When the to-be-deposited substrate 5 performs deposition-reaction in the deposition-reaction chamber 3, a thin film detection apparatus 4 mounted on some unit reaction working positions respectively tracks, in real time, the reaction process of the perovskite thin film.

At step 15, the unload chamber 4 replenishes a gas which is preferably nitrogen or dry air or the like to enable the gas pressure to increase to normal pressure. Next, the door of the unload chamber is opened to deliver out the substrate 5 with a prepared perovskite thin film, so as to complete preparation of one perovskite thin film.

The equally-spaced alternating disposal of the deposition segments and the reaction segments shown in FIG. 2 is a basic form in the rhythmic deposition production equipment of a perovskite thin film in the present disclosure. In an actual production process of the perovskite thin film, in the initial reaction stage, the organic halide deposited on the surface quickly reacts with the metal halide to grow into tiny perovskite seed crystals. In this state, the chemical reaction rate v is high. As the reaction proceeds, the perovskite crystals in the film layer continuously grow such that the organic halide subsequently deposited reacts with the metal halide at a gradually-decreasing reaction rate v. According to different types of the reaction materials and whether doping is performed or not, the chemical reaction rate may firstly decrease quickly and then slowly or firstly slowly and then quickly, but the overall tendency is surely on decrease. Finally, an empirical region formed by perovskite crystallization as shown in FIG. 1 is formed, where an abscissa uses a measurable mesoscopic physical quantity—a thickness T of the reaction-generated perovskite. Based on this empirical process, a same amount of organic halide deposited may take different times to fully react with the metal halide in different reaction stages, and the time will be longer in the later reaction stage. Therefore, the form of rhythmic deposition production equipment of the perovskite thin film is derived from the basic equally-spaced alternating disposal of the deposition segments and the reaction segments into two forms more compliant with the actual production process of the perovskite crystallization: in the first form, the length of the reaction segments is unchanged and the length of the deposition segments decreases; in the second form, the length of the deposition segments is unchanged, and the length of the reaction segments increases. The two types of disposals can be implemented by the detachable evaporation sources in the present disclosure. For example, in the first form, the reaction segments are unchanged, and a longer deposition segment is formed by combining several evaporation sources continuously mounted in the first deposition segment, and then, the number of the evaporation sources combined in the subsequent spaced deposition segments decreases, so as to achieve decrease of the lengths of the deposition segments. For another example, in the second form, the deposition segments are unchanged, and when the evaporation sources are mounted to form the deposition segments, the number of the spaced evaporation source mounting grooves gradually increases, and these mounting grooves without evaporation sources are combined into the reaction segments with lengths gradually increasing, and thus the organic halide deposited subsequently has more time to react fully with the remaining metal halide. As a major characteristic, the flexible rhythmic disposal can be achieved in the present disclosure, which means the vapor phase preparation of the perovskite thin film in different cases can be achieved by using different combinations of the evaporation sources. It should be noted that the above different combinations all belong to the concept of the rhythmic production and thus fall within the scope of protection of the present disclosure.

Embodiment 2

Figure 4:
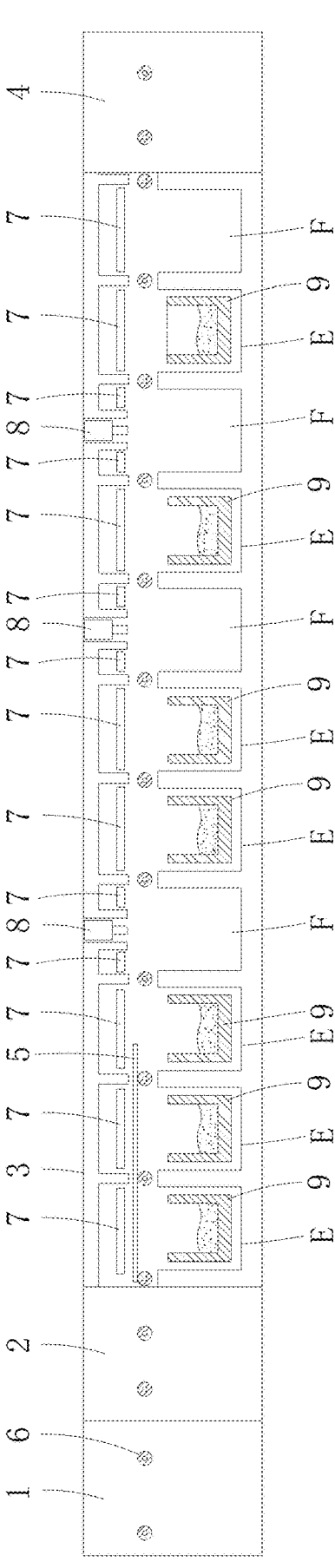
FIG. 4 is a schematic diagram illustrating a structural principle of a rhythmic deposition production method and equipment of a perovskite thin film according to an embodiment 2 of the present disclosure.

With reference to FIG. 4, the present embodiment is a rhythmic production mode with the length of the reaction segments unchanged and the length of the deposition segments decreasing, which is derived from the basic rhythmic deposition production equipment of a perovskite thin film in the embodiment 1. With the first deposition segment formed by three evaporation sources as an example (more in the practical production), the basic process of preparing a perovskite thin film by using the rhythmic deposition production equipment of a perovskite thin film of the present embodiment includes the following steps.

At step 21, nitrogen gas is introduced into the deposition-reaction chamber 3 to increase the gas pressure in the chamber to normal pressure, and then the top cover of the chamber is opened and evaporation sources are mounted in the first to third evaporation source mounting grooves to form the first deposition segment, and then the fourth evaporation source mounting groove is not provided with the evaporation source to form the first reaction segment. Next, evaporation sources are mounted in the fifth to sixth evaporation source mounting grooves to form the second deposition segment, and then, the seventh evaporation source mounting groove is not provided with the evaporation source to form the second reaction segment. Next, one evaporation source is mounted in the eighth evaporation source mounting groove to form the third deposition segment, and the ninth evaporation source mounting groove is not provided with the evaporation source to form the third reaction segment. The tenth evaporation source mounting groove is provided with a backup evaporation source with a double-opening baffle plate disposed at its opening. Further, a thin film detection apparatus is disposed in the first to third reaction segments respectively to track, in real time, the reaction state of the perovskite thin film and transmit state information to the control system. The control system controls the opening and closing of the backup evaporation source to enable another small amount of evaporation material to be deposited on the under-reacted perovskite thin film to ensure full reaction of the thin film.

At step 22, after the evaporation sources are mounted, organic halide powder material is added to each evaporation source in an amount taking up ½ of the groove volume of the evaporation source. Then, the top cover of the deposition-reaction chamber 3 is closed, and vacuumization is performed for the chamber by using the vacuum pump to a gas pressure of $10^3$ Pa. Further, the following process parameters are set in the operation software of the control system: the temperature of the heating chamber 2 is set to 200° C., the heating temperature of the evaporation source is set to 150° C., the temperature of the heating apparatus 7 is set to 100° C., and the rotation speed of the rollers 7 is set to 10 mm/s and the like.

At step 23, after the above process parameters are stabilized, a to-be-deposited substrate 5 on which a metal halide film layer is prepared is placed with a film surface facing down on the support roll located before the load chamber 1. The automatic running mode is started in the control software, and at this time, the door of the load chamber 1 is opened, and the to-be-deposited substrate 5 is conveyed into the load chamber 1 at the speed of 100 mm/s under the drive of the rollers 6, and stopped in the load chamber 1. Then the door of the load chamber 1 is closed. The vacuum pump is started to lower the gas pressure in the chamber. When the gas pressure is lowered to $10^3$ Pa, a door between the load chamber 1 and the heating chamber 2 is opened. Then, the to-be-deposited substrate 5 enters the heating chamber 2 at the speed of 100 mm/s and stops therein and then is quickly heated to the reaction temperature 100° C. After waiting for 60 s, the to-be-deposited substrate 5 enters the deposition-reaction chamber 3 at the speed of 10 mm/s.

At step 24, after entering the deposition-reaction chamber 3, the to-be-deposited substrate 5 firstly runs through the first deposition segment formed by combining three evaporation sources. When the to-be-deposited substrate 5 runs above the three evaporation sources, organic halide gaseous molecules are continuously deposited on the deposition surface and these organic halide gaseous molecules, after being deposited on the metal halide surface, can be quickly reacted, so as to form a perovskite crystal. Meanwhile, the organic halide molecules on the surface also perform diffusion reaction into the film layer to react with the metal halide in the film. When the to-be-deposited substrate 5 continues running to the first reaction segment, the material deposition on the surface is suspended, and the molecular diffusion reaction in the film layer still continues, such that the organic halide deposited in the first deposition segment is fully reacted. For a same assembly, its former portion can firstly enter the reaction segment and its latter portion is still in the deposition segment, which will not affect the uniformity of the finally-formed perovskite thin film because any point on the thin film goes through consistent reaction. Next, the to-be-deposited substrate 5 continues running to the second deposition segment formed of two evaporation sources. Less organic halide is deposited on the to-be-deposited substrate 5 in the second deposition segment than in the first deposition segment, and in the second deposition segment, new organic halide is deposited on the surface and diffuses into the film for reaction. These processes are alternately performed along with the running of the to-be-deposited substrate 5 in the deposition-reaction chamber 3 until the reaction is just completed and the substrate is delivered out of the unload chamber 4, so as to complete the preparation of the perovskite thin film on the substrate 5.

Embodiment 3

Figure 5:
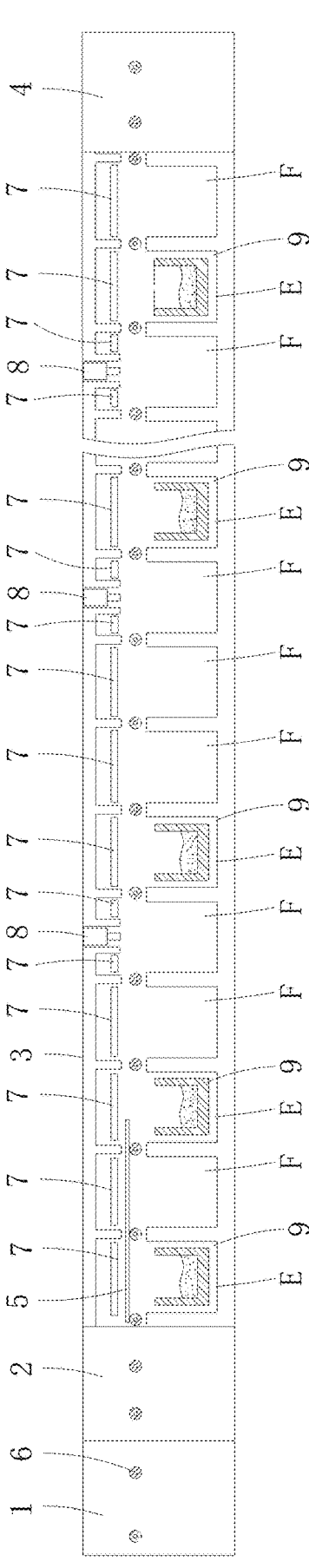
FIG. 5 is a schematic diagram illustrating a structural principle of a rhythmic deposition production method and equipment of a perovskite thin film according to an embodiment 3 of the present disclosure.

With reference to FIG. 5, the present embodiment is a rhythmic production mode with the length of the deposition segments unchanged and the length of the reaction segments increasing, which is derived from the basic rhythmic deposition production equipment of a perovskite thin film in the embodiment 1. The basic process of preparing a perovskite thin film by using the rhythmic deposition production equipment of a perovskite thin film in the present embodiment includes the following steps.

At step 31, nitrogen gas is introduced into the deposition-reaction chamber 3 to increase the gas pressure in the chamber to normal pressure, and then the top cover of the chamber is opened. An evaporation source is mounted in the first evaporation source mounting groove to form the first deposition segment, and then, the second evaporation source mounting groove is not provided with the evaporation source to form the first reaction segment. Next, an evaporation source is mounted in the third evaporation source mounting groove to form the second deposition segment, and then, the fourth to fifth evaporation source mounting grooves are not provided with evaporation sources to form the second reaction segment. Based on the rhythmic arrangement with the length of the deposition segments unchanged and the length of the reaction segments increasing, an evaporation source is mounted in the sixth evaporation source mounting groove to form the third deposition segment, and the seventh to ninth evaporation source mounting grooves are not provided with evaporation sources to form the third reaction segment; an evaporation source is mounted in the tenth evaporation source mounting groove to form the fourth deposition segment, and the eleventh to twelfth evaporation source mounting grooves are not provided with evaporation sources to form the fourth reaction segment (the non-continuous part in drawing represents omission). The fifteenth evaporation source mounting groove is provided with a backup evaporation source with a double-opening baffle plate disposed at its opening. Further, a thin film detection apparatus 8 is disposed in the last evaporation source mounting groove of the second to fourth reaction segments to track, in real time, the reaction state of the perovskite thin film and transmit state information to the control system. The control system controls the opening and closing of the backup evaporation source to enable another small amount of evaporation material to be deposited on the under-reacted perovskite thin film to ensure full reaction of the thin film.

At step 32, after the evaporation sources are mounted, organic halide powder material is added to each evaporation source in an amount taking up ½ of the groove volume of the evaporation source. Then, the top cover of the deposition-reaction chamber 3 is closed, and vacuumization is performed for the chamber by using the vacuum pump to a gas pressure of $10^3$ Pa. Further, the following process parameters are set in the operation software of the control system: the temperature of the heating chamber 2 is set to 200° C., the heating temperature of the evaporation source is set to 150° C., the temperature of the heating apparatus 7 is set to 100° C., and the rotation speed of the rollers 7 is set to 10 mm/s and the like.

At step 33, after the above process parameters are stabilized, a to-be-deposited substrate 5 on which a metal halide film layer is prepared is placed with a film surface facing down on the support roll located before the load chamber 1. The automatic running mode is started in the control software, and at this time, the door of the load chamber 1 is opened, and the to-be-deposited substrate 5 is conveyed into the load chamber 1 at the speed of 100 mm/s under the drive of the rollers 6, and stopped in the load chamber 1. Then the door of the load chamber 1 is closed. The vacuum pump is started to lower the gas pressure in the chamber. When the gas pressure is lowered to $10^3$ Pa, a door between the load chamber 1 and the heating chamber 2 is opened. Then, the to-be-deposited substrate 5 enters the heating chamber 2 at the speed of 100 mm/s and stops therein and then is quickly heated to the reaction temperature 100° C. After waiting for 60 s, the to-be-deposited substrate 5 enters the deposition-reaction chamber 3 at the speed of 10 mm/s.

At step 34, after entering the deposition-reaction chamber 3, the to-be-deposited substrate 5 firstly runs through the first deposition segment. Organic halide gaseous molecules generated by evaporation of the evaporation source of the first deposition segment will be firstly deposited on the metal halide surface of the to-be-deposited substrate 5 and quickly reacted to form a perovskite crystal. At the same time, the organic halide molecules on the surface also perform diffusion reaction into the film layer to react with the metal halide in the film layer. When the to-be-deposited substrate 5 continues running to the first reaction segment, the material deposition on the surface is suspended, and the molecules in the film layer still continue diffusion reaction and thus the organic halide deposited in the first deposition segment can be fully reacted. Next, when the to-be-deposited substrate 5 continues running to the second deposition segment, new organic halide is deposited on the surface and further diffuses into the film for reaction. Since a small amount of perovskite seed crystal is formed in the first deposition segment, the organic halide deposited in the second deposition segment reacts with the metal halide at a lower reaction rate. For this reason, the length of the second reaction segment entered by the to-be-deposited substrate 5 is extended. In this way, the rhythmic production mode with the length of deposition segments unchanged and the length of the reaction segments increasing can be achieved in the present embodiment. Similarly, after running through the third deposition segment, the to-be-deposited substrate 5 enters a longer third reaction segment and thus has more time to perform full reaction until the reaction is completed and the substrate is delivered out of the unload chamber 4, so as to complete preparation of the perovskite thin film on the substrate 5.

The above descriptions are made only to the preferred embodiments of the present disclosure and shall not be intended to limit the present disclosure. Any changes, equivalent substitutions and improvements etc. made within the spirit and principle of the present disclosure shall fall within the scope of protection of the present disclosure.

The invention claimed is:

1. A rhythmic deposition production method of a perovskite thin film, comprising the following process:

depositing a precursor AX material onto a substrate pre-coated with a precursor $BX_2$ film containing a perovskite precursor $BX_2$ material in a deposition reaction chamber;

suspending the deposition after a period of time such that the precursor AX material deposited on a surface of the precursor $BX_2$ film has sufficient time to diffuse into the precursor $BX_2$ thin film so as to form a perovskite $ABX_3$ crystal;

after a period of suspension, the deposition is performed again, such that the deposition and suspension processes are alternately repeated rhythmically and the AX material enters the $BX_2$ film to react with the $BX_2$ material, so as to obtain an $ABX_3$ perovskite crystal without $BX_2$ material residual or with AX material surplus, wherein the deposition duration and the suspension duration are preset, and the rhythmic deposition process is ended after a perovskite $ABX_3$ film with a set thickness is obtained;

wherein the precursor $BX_2$ material is a metal halide material, the precursor AX material is an organic halide powder material, A is a monovalent cation selected from the group consisting of methylamino $CH_3NH_3^+$, ethylamino $CH_3CH_2NH_3^+$, formamidino $CH(NH_2)_2^+$, acetamidino $CH_3C(NH_2)_2^+$, $Na^+$, $K^+$, $Rb^+$ and $Cs^+$, B is a divalent metal cation selected from the group consisting of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, X is a monovalent anion selected from the group consisting of iodine, bromine, chlorine and astatine, and a deposition amount of the precursor AX material deposited in each deposition is 1/n of a total deposition amount required to form a complete perovskite thin film, and wherein the 1/n of the total deposition amount is allowed to fully react before a next deposition, and n refers to a number of unit deposition working positions.

2. The method of claim 1, wherein the prepared perovskite $ABX_3$ film has a thickness of 100 nm to 1000 nm.

3. The method of claim 1, wherein the deposition and suspension processes are performed in a vacuum environment with a vacuum degree of 1 Pa to 50000 Pa.

4. The rhythmic deposition production method of claim 1, wherein the precursor AX material is evaporated at a temperature of 80° C. to 300° C.

5. A rhythmic deposition production equipment of a perovskite thin film, comprising a deposition reaction chamber, wherein, the deposition reaction chamber comprises two functional regions comprising a deposition functional region and a reaction functional region, the deposition functional region comprises one or more deposition segments, the deposition segments comprise at least one unit deposition working position, an evaporation source is disposed inside each unit deposition working position, and the evaporation source is configured to receive a precursor AX material; the reaction functional region comprises one or more reaction segments, the reaction segments comprise at least one unit reaction working position, an evaporation source is not disposed inside each unit reaction working position, the deposition segments are spaced apart from the reaction segments, the deposition reaction chamber is in communication with a vacuum pump through a pipe, and a heating apparatus is further disposed inside the deposition reaction chamber to heat a to-be-deposited substrate pre-coated with a precursor $BX_2$ thin film containing a perovskite precursor $BX_2$ material;

wherein the precursor $BX_2$ material is a metal halide material, the precursor AX material powder is an organic halide powder material, A is a monovalent cation selected from the group consisting of methylamino $CH_3NH_3^+$, ethylamino $CH_3CH_2NH_3^+$, formamidino $CH(NH_2)_2^+$, acetamidino $CH_3C(NH_2)_2^+$, $Na^+$, $K^+$, $Rb^+$ and $Cs^+$, B is a divalent metal cation selected from the group consisting of lead, tin, tungsten, copper, zinc, gallium, germanium, arsenic, selenium, rhodium, palladium, silver, cadmium, indium, antimony, osmium, iridium, platinum, gold, mercury, thallium, bismuth and polonium, X is a monovalent anion selected from the group consisting of iodine, bromine, chlorine and astatine, and a deposition amount of the precursor AX material deposited in each deposition is 1/n of a total deposition amount required to form a complete perovskite thin film, and wherein the 1/n of the total deposition amount is allowed to fully react before a next deposition, and n refers to a number of unit deposition working positions.

6. The equipment of claim 5, further comprising a transport apparatus for transporting the to-be-deposited substrate, a load chamber, a heating chamber, an unload chamber, and a control system, the load chamber and the heating chamber are sequentially disposed at a front portion of the deposition reaction chamber, the unload chamber is disposed at a rear portion of the deposition reaction chamber, the transport apparatus is in communication with the load chamber, the heating chamber, the deposition reaction chamber and the unload chamber respectively, a thin film detection apparatus is disposed at some of the unit reaction working position, the thin film detection apparatus comprises at least one of an imaging detection system, an ultraviolet visible light spectrometric detection system (UV-vis), a photoluminescent detection system (PL), and an X-ray diffraction system (XRD), the control system is configured to feedback-control an operation of an evaporation source in the one or more deposition segments located downstream of the thin film detection apparatus based on a signal acquired by the thin film detection apparatus, a double-opening baffle plate is disposed at an opening of the evaporation source of a rear section of the deposition reaction chamber, and to feedback-control the operation of the evaporation source, the control system is further configured to:

control, by a software, the opening of the evaporation source of a subsequent deposition segment to open or close based on a deviation value between state information of a current to-be-deposited substrate and state information of standard substrate and control a reaction process of the perovskite thin film.

7. The equipment of claim 5, wherein the evaporation source comprises an evaporation crucible with an opening facing upward, the evaporation crucible comprises a heat insulation layer disposed outside, a heating layer disposed in middle and a heat conducting layer disposed inside, and the heating layer is provided with a heating power line connected with an external power supply interface.

8. The equipment of claim 5, wherein the unit deposition working positions have a length of $L_{di}=v*t_d/n$, and unit reaction working positions have a length of $L_{ri}=V*t_r/m$, wherein, v is a moving speed of the to-be-deposited substrate, $t_d$ is a deposition time required to form a perovskite film, $t_r$ is a reaction time required to form a perovskite film, and $t_d:t_r=1:0.5$ to $1:100$, and m refers to a number of the unit reaction working positions.

9. The equipment of claim 8, wherein lengths of the deposition segments and the reaction segments of the deposition reaction chamber sequentially decrease respectively along a direction of front and rear sections of the deposition reaction chamber.

10. A method of depositing a perovskite film on a substrate by using the rhythmic deposition production equipment according to claim 5, comprising the following steps:

at step 1, adding a precursor AX material to the evaporation source of each unit deposition working position in the deposition reaction chamber, and adjusting a vacuum degree of the deposition reaction chamber and starting the heating apparatus;

at step 2, placing a to-be-deposited substrate pre-coated with a precursor $BX_2$ film containing a perovskite precursor $BX_2$ material into the deposition reaction chamber, and enabling the to-be-deposited substrate to sequentially go through the deposition segments and the reaction segments, and obtaining a perovskite $ABX_3$ film generated by reaction on the substrate.

11. The equipment of claim 6, wherein the transport apparatus comprises rollers driven by a servo motor, the to-be-deposited substrate is conveyed by the rollers, and the to-be-deposited substrate is placed with a deposition surface facing down on a support roll of the rollers.

12. The equipment of claim 11, wherein the evaporation source is a detachable evaporation source;

an evaporation source mounting groove is disposed between every two of the rollers; and some of the evaporation source mounting grooves are selectively mounted with the evaporation source to form the deposition segments while other evaporation source mounting grooves are not mounted with the evaporation source to form the reaction segments, so as to flexibly construct production lines with different rhythmic disposal.

13. The equipment of claim 9, wherein the deposition segments and the reaction segments are alternately disposed in two forms, and the two forms include:

a first form, wherein a length of the reaction segments is unchanged and a length of the deposition segments decreases; or a second form, wherein the length of the deposition segments is unchanged, and the length of the reaction segments increases.

\* \* \* \* \*